United States Patent
Druijf et al.

(10) Patent No.: US 6,178,119 B1
(45) Date of Patent: Jan. 23, 2001

(54) METHOD OF ERASING A NON-VOLATILE MEMORY

(75) Inventors: Klaas G. Druijf; Jan Lindeman, both of Nijmegen (NL)

(73) Assignee: U.S. Philips Corporation, New York, NY (US)

(*) Notice: Under 35 U.S.C. 154(b), the term of this patent shall be extended for 0 days.

(21) Appl. No.: 09/353,988

(22) Filed: Jul. 15, 1999

(30) Foreign Application Priority Data

Jul. 17, 1993 (EP) .................................................. 98202407

(51) Int. Cl.$^7$ ..................................................... G11C 16/04
(52) U.S. Cl. ............................... 365/185.32; 365/185.29; 365/185.33
(58) Field of Search ........................ 365/185.29, 185.33, 365/185.32

(56) References Cited

U.S. PATENT DOCUMENTS

| 5,386,388 | 1/1995 | Atwood et al. .................... 365/201 |
| 6,028,787 | * 2/2000 | Sansbury et al. ............... 365/185.01 |

* cited by examiner

*Primary Examiner*—Richard Elms
*Assistant Examiner*—VanThu Nguyen
(74) *Attorney, Agent, or Firm*—Steven R. Biren

(57) ABSTRACT

To improve the efficiency of UV erasing in a non-volatile memory, there is proposed to carry out the erase step at an elevated temperature, for example, a temperature lying between 200 and 300° C. In this way a decrease of about 0.5 volt of the threshold voltage of the erased cell may be obtained compared to a standard UV erasure. This makes it also possible to lower the supply voltage.

4 Claims, 1 Drawing Sheet

METHOD OF ERASING A NON-VOLATILE MEMORY

BACKGROUND OF THE INVENTION

The invention relates to a method of erasing a non-volatile semiconductor memory cell having a floating gate electrode by radiating the floating gate electrode with short-wave radiation, more particularly by radiating with radiation in the ultraviolet range of the spectrum. In most embodiments, the memory cell together with a large number of other, identical cells forms a non-volatile programmable memory, mostly referenced as EPROM in the literature. The cell is then formed by an n-channel MOS transistor in which the conductance of the channel area is determined by the charging state of the floating gate electrode provided over the channel area and electrically insulated therefrom. Starting from the supposition that (by way of example) the uncharged state of the floating gate electrode corresponds to a "0", the cell may be programmed by storing electrons on the floating gate as a result of which the threshold voltage $V_{th}$ of the transistor is increased (logic "1") compared to the uncharged state. By applying to the control gate of the transistor a voltage between these two threshold voltage values and determining the conductance by the transistor, the stored information may be read out. As is generally known, the information may be erased by means of UV radiation, so that the electric charge of the floating gate electrode is removed and the cell is rendered suitable for re-use.

In practice it has appeared that the lowest value for the threshold voltage that may be obtained by erasing with UV radiation is rather high. This value depends to a certain extent on the production process and on a number of other factors such as wavelength of the UV radiation. For a specific process and a standard-wavelength UV radiation, the threshold voltage of the erased cell was about 1.9 volts, and 4 volts for the programmed cell. This means that a gate voltage of at least about 3 volts is to be applied for the reading operation. This value is therefore considered to be high, because in electronics there has been a tendency the past few years towards lower supply voltages and lower powers.

SUMMARY OF THE INVENTION

Therefore, it is an object of the invention to provide, inter alia, a method of erasing by means of UV radiation the information stored on the floating gate, so that a lower threshold voltage may be obtained than with the known method. A method according to the invention is therefore characterized in that the cell is heated during radiation. Experiments have shown that due to the higher temperature during erasure a considerable reduction of the threshold voltage may be obtained. For example, a reduction of 0.2–0.3 volt was advantageously obtained at a temperature of 100° C. A preferred embodiment of a method according to the invention is therefore characterized in that the cell is heated up during radiation to a temperature in the region from 200° C. to 300° C. With a temperature in this region, a reduction of about 0.5 volt (relative to 1.9 volts) of the threshold voltage may be obtained. As a result, a gate voltage of, for example, no more than 1.8 volts can be used for reading.

These and other aspects of the invention will be apparent from and elucidated with reference to the embodiments described hereinafter.

DESCRIPTION OF THE PREFERRED EMBODIMENTS

Figure 1:
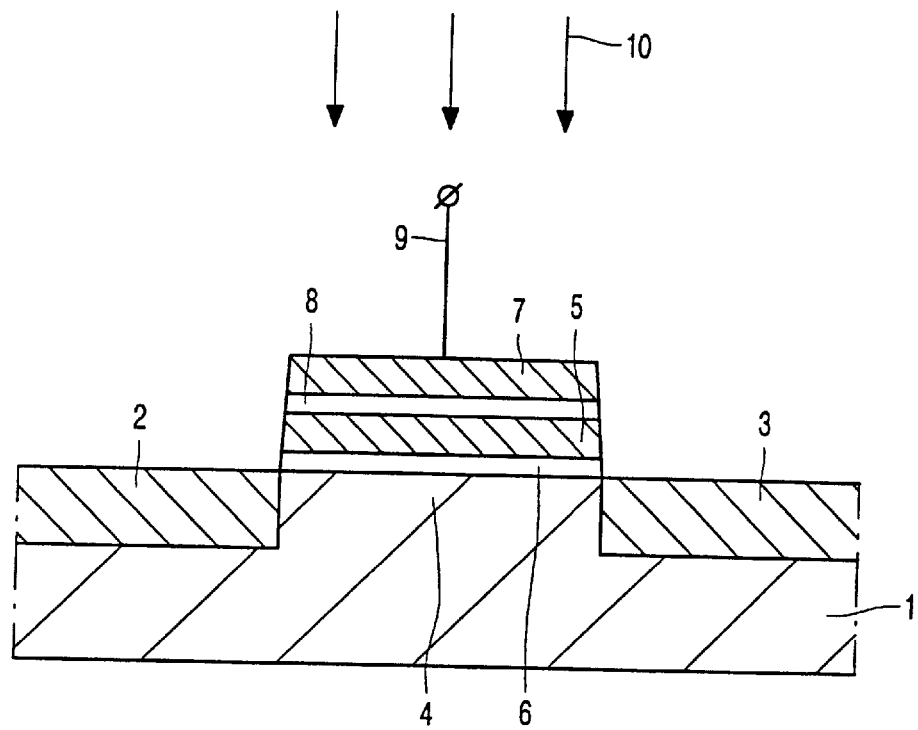
FIG. 1 shows a cross-section of a conventional non-volatile memory cell with a floating gate.

FIG. 1 shows a diagrammatic cross-section of a non-volatile memory cell known per se which forms part of, for example, an EPROM. The arrangement comprises a silicon semiconductor body of which at least surface area 1 shown in the drawing is of the p-conductivity type. Area 1 comprises two n-type surface areas 2 and 3 which form supply and discharge zones of a MOS transistor having a floating gate. The zones 2 and 3 are separated by the channel area 4. The floating gate 5 is situated over the channel 4 and electrically insulated therefrom by the dielectric coating 6, in this example a silicon oxide layer. Over the floating gate 5 is provided a control gate 7 which is separated from the floating gate 5 by an intermediate dielectric 8. Via a connection 9 shown in the diagram, a suitable voltage may be applied to the gate 7. The dielectric 8 may be formed, for example, by a silicon oxide layer or an oxide nitride layer or a combination of various dielectric layers.

As is known, data may be written by applying an electric charge in the form of electrons to the floating gate 5, for example, by tunnelling or hot electron injection, which data continues to be stored on gate 5 because the gate 5 is completely surrounded by electrically insulating material. The uncharged state then corresponds, for example, to a "0"; the charged state then corresponds to a "1". The charging state determines the threshold voltage of the transistor with the threshold voltage $V_{th}$ being low in the "0" state and the threshold voltage $V_{th}$ being high in the "1" state. The cell may be read out by applying to the gate 7 a voltage lying between these two threshold voltage values and determining the conductance through the transistor at this gate voltage.

Figure 2:
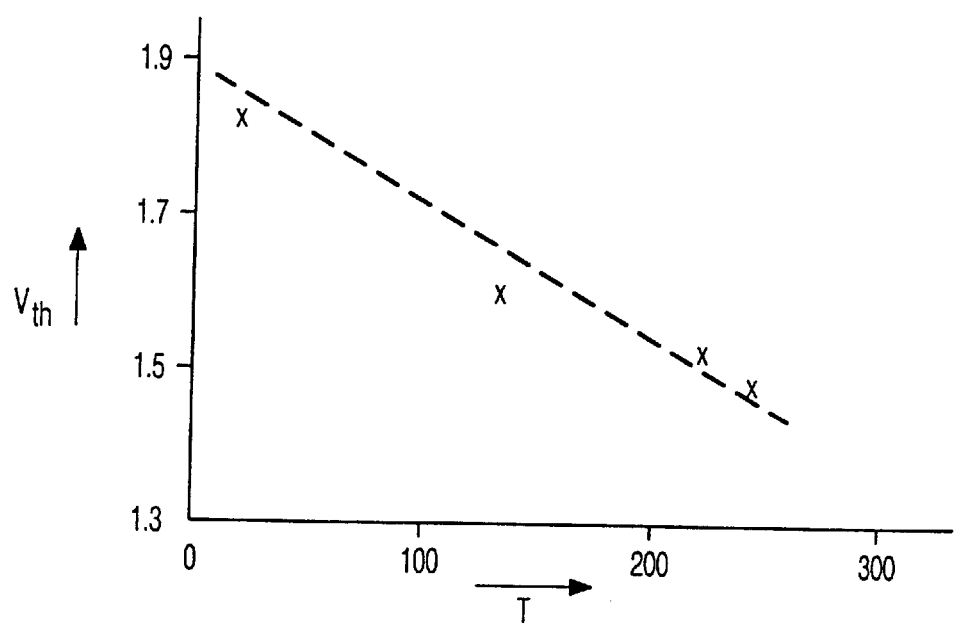
FIG. 2 shows the relation between the threshold voltage of this memory cell and the erasing temperature when a method according to the invention is implemented.

The information is erased by radiating with short-wave radiation, more particularly, UV radiation having an energy between 3 and 4 eV. As a result of the radiation, the electrons of the floating gate receive sufficient energy for exceeding the potential barrier of the dielectric between the floating gate 5, on the one hand, and the substrate 1 and/or the control gate 7, on the other hand. In practice, however, it has appeared that when UV radiation is used for erasure in customary fashion, the threshold voltage $V_{th}$ sticks to a relatively high value, for example, about 1.9 volts for a specific process and does not go back to the original low value of, for example, about 1 volt. To nevertheless obtain a lower $V_{th}$, the UV radiation does not take place at room temperature but at a higher temperature, that is to say, a temperature of at least 100° C. Surprisingly, it has appeared that due to the higher temperature, the threshold voltage $V_{th}$ becomes much lower than with UV radiation at room temperature. FIG. 2 shows a curve obtained from experiments, which shows the relationship between the temperature in degrees Celsius and $V_{th}$ in volts. As may be observed from the drawing, a reduction of the threshold voltage $V_{th}$ of about 0.5 volt may be obtained by erasing at, for example, 250° C. This makes it possible to operate the circuit with a lower supply voltage.

It will be evident that the invention is not restricted to the example of embodiment described here, but that within the scope of the invention a great many variations are still open to those skilled in the art. For example, the conductivity types in the described example may be reversed.

What is claimed is:

1. A method of erasing a non-volatile semiconductor memory cell having a floating gate electrode by radiating the floating gate electrode with short-wave radiation, characterized in that the cell is heated during radiation.

2. The method as claimed in claim 1, characterized in that the cell is heated to a temperature of at least 100° C.

3. The method as claimed in claim 2, characterized in that the cell during radiation is heated to a temperature lying between 200° C. and 300° C.

4. The method as claimed in claim 1, wherein said short-wave radiation comprises radiation in the ultraviolet range of the spectrum.

* * * * *